(12) United States Patent
Erylimaz et al.

(10) Patent No.: US 9,926,622 B2
(45) Date of Patent: Mar. 27, 2018

(54) METHODS FOR FORMING PITTING RESISTANT CARBON COATING

(71) Applicant: UCHICAGO ARGONNE, LLC, Chicago, IL (US)

(72) Inventors: Osman L. Erylimaz, Plainfield, IL (US); Harpal Singh, Cuyahoga Falls, OH (US); Aaron C. Greco, Chicago, IL (US); Jair G. Ramirez Gonzalez, Naperville, IL (US); Ali Erdemir, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 97 days.

(21) Appl. No.: 14/939,604

(22) Filed: Nov. 12, 2015

(65) Prior Publication Data

US 2017/0137926 A1    May 18, 2017

(51) Int. Cl.
*C23C 16/27* (2006.01)
*C23C 14/35* (2006.01)
*C23C 14/06* (2006.01)
*C23C 14/34* (2006.01)
*C23C 14/02* (2006.01)
*C01B 32/25* (2017.01)

(52) U.S. Cl.
CPC .......... *C23C 14/0611* (2013.01); *C01B 32/25* (2017.08); *C23C 14/021* (2013.01); *C23C 14/024* (2013.01); *C23C 14/0605* (2013.01); *C23C 14/0635* (2013.01); *C23C 14/3485* (2013.01); *C23C 14/35* (2013.01)

(58) Field of Classification Search
CPC ....... C23C 16/27; C23C 16/32; C23C 16/325; C23C 14/021; C23C 14/061; C23C 14/35
See application file for complete search history.

(56) References Cited

U.S. PATENT DOCUMENTS

| | | | | |
|---|---|---|---|---|
| 5,645,900 A * | 7/1997 | Ong | ................... | C23C 16/0272 427/255.7 |
| 5,955,212 A * | 9/1999 | Matsumoto | ......... | C23C 16/0209 427/249.18 |
| 7,416,786 B2 | 8/2008 | Oda et al. | | |
| 7,939,172 B2 | 5/2011 | Gorokhovsky et al. | | |
| 8,561,707 B2 | 10/2013 | Jin et al. | | |
| 2002/0041930 A1* | 4/2002 | Erdemir | ................ | C23C 16/029 427/249.7 |
| 2004/0244539 A1* | 12/2004 | Korb | ..................... | B21D 53/64 76/104.1 |
| 2005/0119136 A1* | 6/2005 | Castle | .................. | C10M 135/18 508/363 |
| 2006/0093839 A1 | 5/2006 | Okamoto et al. | | |
| 2007/0284255 A1 | 12/2007 | Gorokhovsky et al. | | |
| 2011/0017997 A1* | 1/2011 | Kamath | ............ | H01L 29/78603 257/66 |
| 2012/0103182 A1 | 5/2012 | Sugimoto | | |
| 2014/0023864 A1* | 1/2014 | Sumant | .................... | B05D 5/08 428/408 |
| 2015/0037710 A1 | 2/2015 | Cooke et al. | | |
| 2015/0235864 A1* | 8/2015 | Vogt | .................. | H01L 21/31155 438/694 |

OTHER PUBLICATIONS

Dong, Ze Hua, et al., "Initiation and repassivation of pitting corrosion of carbon steel in carbonated concrete pore solution". Corrosion Science 53 (2011) 1322-1330.*
Cloutier, M., et al., "Long-term stability of hydrogenated DLC coatings: Effects of aging on the structural, chemical and mechanical properties". Diamond & Related Materials 48 (2014) 65-72.*
Hauert, R., "An overview on the tribological behavior of diamond-like carbon in technical and medical applications". Tribology International 37 (2004) 991-1003.*
Svahn et al., The influence of surface roughness on friction and wear of machine element coatings, Wear, vol. 254, Issue 11, Oct. 2003, pp. 1092-1098.

* cited by examiner

*Primary Examiner* — Bret P Chen
(74) *Attorney, Agent, or Firm* — Foley & Lardner LLP (57) ABSTRACT

A method for making a pitting resistant carbon coating that includes a hydrogenated diamond-like coating ("H-DLC"). The H-DLC is relatively soft and elastic. Unlike hard and/or inelastic coatings in the prior art, the present coatings do not exhibit a loss of adhesion (delamination). A bonding layer may be deposited on a metallic substrate and the deposited H-DLC on the bonding layer.

9 Claims, 11 Drawing Sheets

METHODS FOR FORMING PITTING RESISTANT CARBON COATING

STATEMENT OF GOVERNMENT INTEREST

The United States Government has rights in the invention described herein pursuant to Contract No. DE-AC02-06CH11357 between the United States Department of Energy and UChicago Argonne, LLC, as operator of Argonne National Laboratory.

FIELD OF THE INVENTION

The present invention generally relates to carbon coatings.

BACKGROUND OF THE INVENTION

Pitting is a major source of failure in gear and bearing devices. The repeated cycling of loads and changes in slide to roll ratios leads to the formation of cracks on stressed surfaces. These initial cracks propagate in micro-pitting. This micro-pitting then grows over time to form macro-pitting, which typically results in component failure. Such failure is addressed in the prior art by using precisely controlled surface roughness, lubricant and additives in lubricant, and use of high-purity metallic components, which is very costly.

Further, gear and bearing devices are being developed and applied to new technologies that present additional challenges. For example, wind energy is a promising and fastest growing power generation source that relies heavily on gear and bearing devices with specific reliability needs. An increase in the number of utility scale wind plants have increased the focus on the high operation and maintenance costs of wind turbines as these ultimately impact the cost of wind energy. The drive train and actuators of wind turbines are major sources of failures arising from the variability of wind, torque reversals, fluctuation in energy demands, misalignment, and harsh environment conditions. Bearings and gears in wind turbine drive trains suffer from failure modes like micropitting, scuffing, spalling, and smearing, although these elements were designed to meet twenty year service lives assuming that proper lubrication and maintenance practices, and especially no unusual loads were encountered. If a bearing has a low concentration of non-metallic inclusions in the steel, operates at the designed contact stress, and maintains an adequate lubricant film thickness in the contact, then end of service life will be due to sub-surface originated spalling. Surface originated fatigue or pitting is caused by surface or near surface stress risers such as non-metallic inclusions, plastically deformed material, martensite transformation products, or several other factors. A particular type of surface initiated fatigue is known as micropitting which is a common failure mode encountered by gears and bearings. Specifically, many main shaft spherical roller bearings in wind turbines are life limited due to spalls arising from micropitting wear. Micropitting is associated with the initiation and propagation of micro-cracks in the direction of traction forces. The progression of micro-pits alters the surface profile of a bearing raceway or gear tooth which generates regions of large stress concentrations. The increase in localized stresses leads to fatigue failure through the formation of macro-pits or spalls. Micropitting is affected by several factors such as lubricant type, contaminants, temperature, contact stresses, hardness, sliding speed, and surface roughness.

Studies were carried out over the last few decades to understand the mechanism of micropitting. According to Morales-Espejel and Brizmer, micropitting depends on the lubrication conditions and roughness of the contacting surfaces, the presence of slip (between 0.5 and 2%), and the associated boundary friction shear stress are required for the generation of micropitting. Oila and Bull suggested that contact stress has the greatest impact on micropitting initiation, while the progression of micropitting is affected mostly by speed and slide to roll ratio. Lubrication conditions are best quantified by the parameter lambda ($\Lambda$), which is the ratio of the lubricant film thickness to the square root of composite surface roughness. Operating temperature, viscosity, and operating speed all affect the lubricant film thickness and hence $\Lambda$. Brechot et al reported that oils with antiwear and extreme pressure additives that are used to prevent scuffing and wear can promote micropitting. Micropitting has proven to be difficult to eliminate through lubricant chemistry alone.

A number of solutions have been suggested to mitigate micropitting. Super-finishing is a process used on gear teeth to increase load bearing area and reduce the severity of asperity interactions in boundary lubrication (i.e., $\lambda<1$). Apart from super-finishing, other surface engineering techniques are also employed to reduce asperity contact and provide barriers to wear. Physical vapor deposition (PVD) coatings composed of nitrides, sulfides and carbides were examined for their ability to prevent micropitting. PVD coatings can be very effective at reducing or eliminating many wear modes. Among these coatings, diamond like carbon (DLC) coatings are now being used in numerous applications for wear resistant purposes due to their desirable tribological performance. DLC has been modified over the years to possess ultra-low friction and high wear resistance. DLC coatings can be doped or alloyed to increase their functionality. The properties (hardness, toughness, thermal stability) of DLC coatings are further increased by using novel coating architectures that consist of nanocrystalline precipitates and nanosized multilayers. Hydrogen-free DLC coatings deposited from solid carbon targets can be extremely hard, while hydrogenated DLCs are usually much softer. In this research, coatings having indentation hardness values greater than 10 GPa are referred to as hard coatings, while coatings with indentation hardness values less than 10 GPa are referred to as soft coatings. Precursor hydrocarbon gases such as methane and acetylene are typically used in the deposition of DLC that contain large amounts of hydrogen. Hard DLC have been shown to be very successful at mitigating many wear issues encountered by bearings and gears operation in boundary lubrication, including micropitting. Surface treatments such as black oxide and phosphate conversions are also applied to bearings and gears to address micropitting. These conversions are thick, sacrificial layers that work to rapidly break-in the surfaces of the components, reducing asperity contact, and delaying the onset of micropitting. Most of the studies reported on exploring the use of DLC to mitigate micropitting prevention were carried out with hard DLC coatings.

SUMMARY OF THE INVENTION

One embodiment of the invention relates to an article of manufacture. The article comprises a metallic substrate. A carbide bonding layer is deposited the metallic substrate. A hydrogenated diamond-like coating is deposited on the carbide bonding layer. The hydrogenated diamond-like coating has a hardness of 2-7 GPa and an elasticity of equal to or less than 60 GPa.

Another embodiments relates to a method of making a pitting resistant carbon coating. The method comprises removing organic material from a metallic substrate; etching the surface of the metallic substrate; depositing a carbide forming layer on the etched metallic substrate; exposing the carbide forming layer to methane gas, forming a carbide layer; and depositing an amorphous hydrogenated diamond-like coating on the carbide layer. The hydrogenated diamond-like coating has a hardness the range of 2-7 GPa and an elasticity equal to or less than 60 GPa.

Another embodiment relates to a composition comprising a hydrogenated diamond-like coating deposited on a substrate. The hydrogenated diamond-like coating has a hardness the range of 2-7 GPa and an elasticity equal to or less than 60 GPa.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIGS. 2A and 2B show an optical image of the cylindrical roller and the track width prior to testing, where

FIGS. 5A-5D show Traction coefficient and P/P acceleration (vibration) as a function of contact cycles on the roller. Images show the surface of the roller after testing.

FIGS. 6A-6D show high magnification topographical images of roller surfaces after testing.

DETAILED DESCRIPTION OF THE PREFERRED EMBODIMENTS

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

While prior art coatings have focused on hard coating materials to improve gear and bearing surfaces, embodiments of the present invention comprises a high elasticity and low hardness coating. In one embodiment, the coating is a soft (2-7 GPa), highly hydrogenated diamond like coating ("H-DLC"). In one embodiment, "soft" means about 2 GPa to about 7 GPa, preferably 5 GPa to 6 GPa). In one embodiment, "highly hydrogenate" means about 30% to 60% bonded or unbonded hydrogen. As the term "diamond like coating" is used herein, it refers to an amorphous carbon coating deposit by plasma based, plasma vapor deposition or chemical vapor deposition (PVD or CVD). The coating is preferably usable on a metal surface, such as a gear or bearing. Examples described herein may use a general metal surface in place of a gear or bearing of illustrative purposes as a surrogate. "Highly Elastic" as used herein in certain embodiments means a coating having a Young's Modulus of 60 GPa or lower, preferably between about 50 GPa and 60 GPa. In one embodiment, the coating is highly elastic (60 GPa) and soft (6 GPa) with a higher sp2 content (>60%) in comparison to previous NFC coatings.

In one embodiment, a 1/10 ratio, the penetration depth of the indentor (to measure hardness of coating) to the thickness of the coating, is used to avoid influence of the mechanical properties of the substrate. Unlike hard and/or inelastic coatings in the prior art, the present coatings do not exhibit a loss of adhesion (delamination).

In one embodiment, a method of forming the coating includes high power impulse magnetron sputtering (HiPIMS) method. In a preferred embodiment, the surface to be coated is steel. First the surface to be coated is etch to remove contamination layer and improve bonding, followed by metallic bonding layer (such as chromium) applied using HiPIMS. Introduction of methane gas creates a metallic carbide layer on the top of the metallic bonding layer which serves as a second bonding layer with good adhesive properties. Further the methane/Argon gas flow and solid graphite source using DC magnetron sputtering produces an amorphous hydrogenated carbon coating which contains sp2 and sp3 bonded carbon atoms on the metallic carbide layer. The combination of the methane/Argon gas and a graphite solid target with a DC power applied produces the characteristic soft quality of these coatings. The coating thus obtained has an amorphous carbon layer that provides low friction (in one embodiment, less than about 0.1 coefficient of friction in lubricated conditions), high wear resistance (more than twice the wear resistance compared to uncoated in current test conditions and yet extreme resistance to cyclic loads and therefore, prevents micro/macro-pitting.

Experimental results, described further below, showed that the uncoated, steel on steel, material pair failed after 32 million cycles due to excessive surface damage. Large pits were observed on the roller due to damage accumulation and caused the P/P acceleration to exceed the cut-off limit. Based upon the observations of Fajdiga et al., the surface damage on the roller appears to have initiated with micropits, evolved into macropits, that coalesced and formed the continuous surface damage in the wear track. Remarkable reductions in surface damage of the roller were observed when one or both elements were coated with an embodiment of the H-DLC. Traction coefficients were ~0.04 and remained relatively constant throughout the testing for the three cases where at least one of the contacting surfaces was coated. Furthermore, no failures were observed and the tests were suspended after ~100 million cycles. It is believed that the H-DLC described herein is a promising surface treatment candidate to mitigate fatigue-initiated micropitting wear on surfaces of components operating in low A ratio rolling and mixed mode contacts.

Friction reduction and wear protection are the primary motivations for using coatings on bearings and gears. Surface modifications that use coatings and thin films offer numerous technical advantages over untreated materials. Under boundary conditions in wind turbine drive trains, physical vapor deposition ("PVD") coatings such as WC/a-C:H, and conversion coatings such as black oxide are widely used on the bearings and gears to improve tribological performance. Although conversion coatings are typically considered to be sacrificial and used primarily to prevent adhesive wear damage during run-in, new evidence has been generated that suggests that black oxide surface treatments on the raceways and rollers of wind turbine gearbox bearings may delay the onset of another failure mode termed white etch cracking. Mahmoudi et al. and Evans et al. reported that black oxide is not an attractive candidate for preventing scuffing wear arising from roller/raceway skidding in highly stressed, low A environments. Although a hard WC/a-C:H (14 GPa) coating applied to the rolling elements of bearings functioned very well in mitigating micropitting, scuffing, and fatigue life reduction from debris damage, fracture-type wear of the coating was observed to occur at high contact stress cycles and ±10% slide/roll ratios. The WC/aC:H coating is believed to provide wear protection by polishing the uncoated mating surface and form a barrier to the adhesive interactions of asperities. Both of these proposed mechanisms have a positive effect on fatigue wear by increasing the A ratio and transitioning the elastohydrodynamic lubrication ("EHL") regime from boundary to mixed.

Fewer investigations have been performed on the abilities of soft coatings to improve fatigue performance. Moorthy et al compared the rolling contact fatigue performance of a soft Nb—S coating to a hard WC/a-C:H coating. Although the Nb—S coating exhibited no polishing effect during the tests, no significant micropitting was observed. Clearly soft coatings like Nb—S, Ti—$MoS_2$, and H-DLC must function differently from hard coatings like WC/a-C:H to provide fatigue life improvements to steel components. Furthermore, since black oxide surface conversions do not mitigate micropitting (surface fatigue wear), the soft coatings must also function differently from a soft black oxide.

Where a coated surface acts against (or is acted against) an uncoated surface, a transfer layer of H-DLC on the uncoated surface may form. Carbon from the H-DLC forms an amorphous carbon tribofilm containing iron oxide on uncoated steel surfaces during testing. This is supported by the Raman spectrum of the tribofilm formed on the uncoated roller (H-DLC ring/uncoated roller pairing) shown in FIG. 8. The spectrum shows the D and G mode vibrational signature of amorphous carbon. The low friction of the amorphous carbon tribofilm may be sufficient to reduce the magnitude of shear stresses generated on the roller surface during testing. Morales-Espejel and Brizmer point out that the presence of slip and the associated boundary friction shear stress are required for the generation of micropitting. Lubricant additives or low friction coatings that can reduce boundary friction shear stress should delay or mitigate micropitting. A friction coefficient between 0.001-0.005 and wear rates between $10^{-11}$-$10^{-10}$ $mm^3$/Nm have been measured on H-DLC films in vacuum environments. Although black oxide surface treatments can obtain smooth interfaces, the magnitude of the measured traction forces with small amounts of slip are not as small as those obtained with the H-DLC coating. Therefore it is concluded that the shear stresses between black oxide treated surfaces are still large enough to initiate micropitting in boundary lubrication contact.

Examples—Coating on AISI 52100 Steel

A H-DLC coating was deposited on AISI 52100 steel specimens using a magnetron sputter deposition system were tested using a Micro-Pitting-Rig (MPR) at 1.8 GPa contact stress, 40% slide to roll ratio in polyalphaolefin base (PAO) oil. The post-test analysis was performed using optical microscopy, surface profilometry, and Raman spectroscopy. The results showed a great potential for these coatings in sliding/rolling contact applications as no failures were observed with coated specimens even after 100 million cycles compared to uncoated test pairs which failed after 32 million cycles. The elastic modulus of the coating is approx. 50-60 GPa, which is ¼th of the elastic modulus (Young's Modulus) of steel 210 GPa, and the coating has a hardness of 6 GPa compared to 9 GPa of steel.

Test Apparatus

Figure 1A:
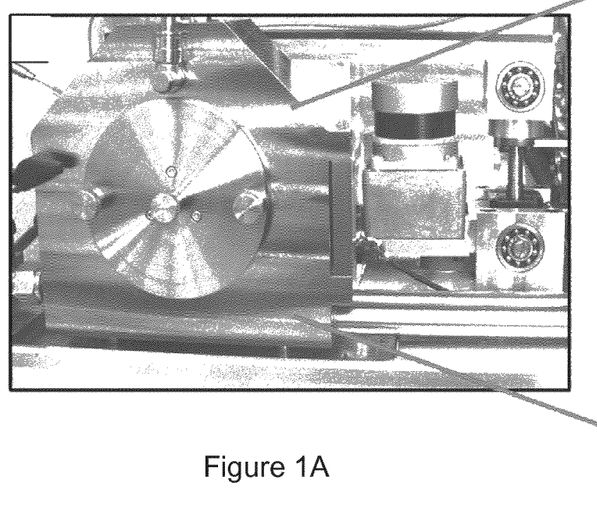
FIG. 1A shows the micropitting rig test chamber.
Figure 1B:
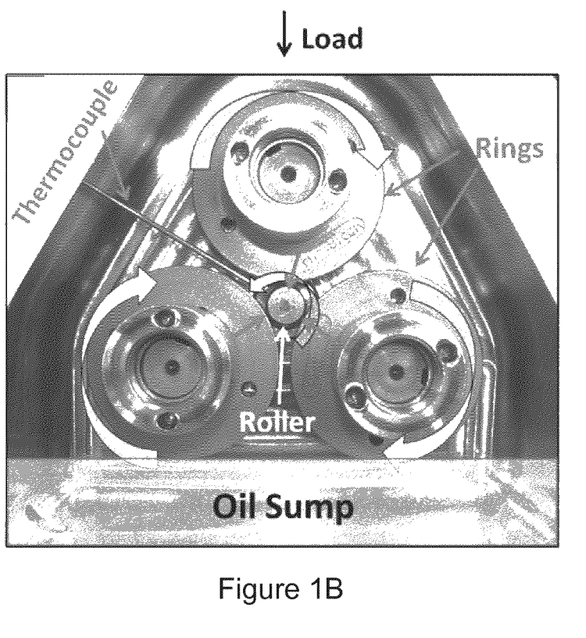
FIG. 1B shows the arrangement of rings and roller inside the test chamber of FIG. 1A. The roller had a 10° chamfer on each side of a 1 mm track width.

A PCS Instruments Micropitting Rig (MPR) was used for testing. The MPR is a computer controlled three rings on roller tribometer. A 12 mm diameter roller is mounted in the center and in contact with three rings of 54 mm diameter at an angle of 120°. FIG. 1A shows the MPR test chamber and the arrangement of rings and roller inside the test chamber is shown in FIG. 1B. A thermocouple was installed to measure the contact temperature and an external cooler was connected to control the temperature of the oil inside the test chamber. A load was applied to the top ring (0° position) by means of motorized ball screw, and vibration was measured with a piezoelectric accelerometer. The rig has a capability to control entrainment speed (0-4 m/s), slide to roll ratio (0 to 200%), temperature (25-135 C), and load (0 to 1250 N).

Test Material

Figure 2A:
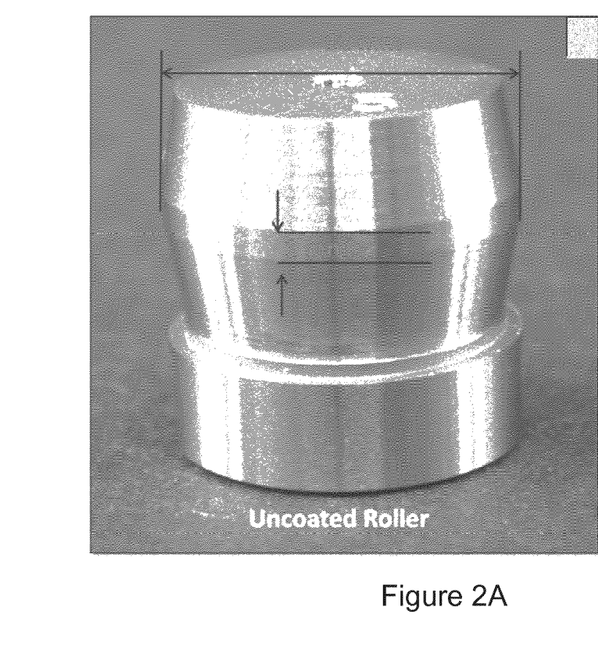
FIG. 2A is AISI 52100 steel roller specimen with dimensions and FIG. 2B is surface topography and track width of the roller prior to testing.
Figure 2B:
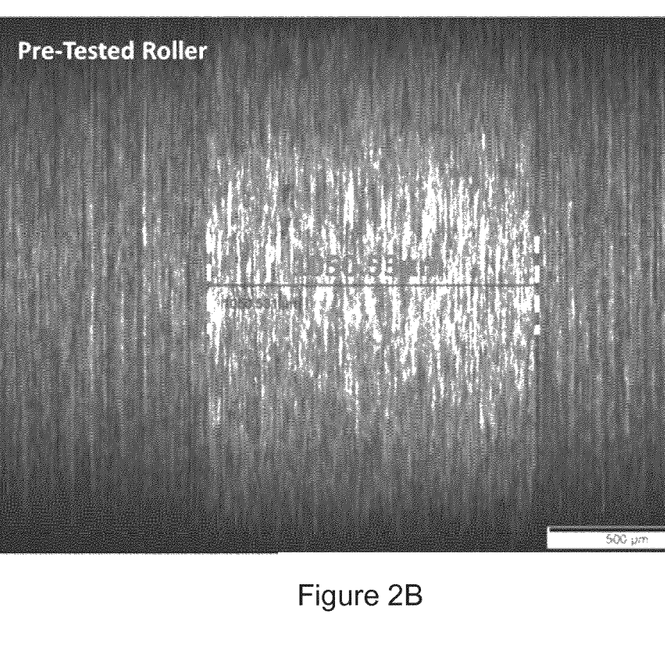

The test material used in this study and their properties are given in Table 1. The roller had a 10° chamfer on each side of a 1 mm track width as shown in FIG. 2A. Rollers and rings were made of AISI 52100 steel and heat-treated to hardness values of 57-60 HRC and 62-65 HRC, respectively. The average surface roughness measured on the ring was about $R_a=0.3$ μm and roughness of the rollers was about $R_a=0.2$ μm. FIG. 2A shows an optical image of the cylindrical roller and the track width prior to testing.

TABLE 1

Test Material and Properties

| Specimen Type | Material | Hardness (HRC) | Roughness, μm | Diameter, mm |
|---|---|---|---|---|
| Rings | AISI 52100 Steel | 63-65 | 0.2 | 54.15 |
| Roller | AISI 52100 Steel | 57-60 | 0.3 | 12 |

Table 2 presents the test parameters used for evaluating the tribological performance of different material combinations. An unadditized polyalphaolefin base stock oil of viscosity grade 4 was used as the lubricant, which was used to eliminate the contribution of additives on the performance of the coatings and also to ensure that a severe boundary regime was in place. Tests were performed at a 430 N load, 3 ms$^{-1}$ speed, 40% slide-to-roll ratio (SRR) and at a constant operating temperature of 55° C. The λ values were estimated to be 0.36 which confirms direct metal-to-metal contact.

TABLE 2

Test Parameters

| | Force, N | Hertzian Stress, GPa | Lambda, λ | Speed, m/s | Slide to Roll Ratio (SRR) | Temperature, ° C. |
|---|---|---|---|---|---|---|
| PAO4 | 430 N | 1.8 | 0.36 | 3 | 40% | 55 |

Rollers and rings were coated with the highly hydrogenated diamond-like carbon (H-DLC) coating. Prior to coating, specimens were ultrasonically cleaned using a solvent and dried in hot air before mounting on fixtures inside the deposition chamber. A pulsed magnetron sputtering system was used for the deposition of the coatings using two carbon targets. The power supplied to carbon targets was in the range of 1000-2000 W and pulsed DC bias of −35 to −50 volts was supplied at 250-350 KHz. Methane (CH$_4$) and Argon (Ar) gas mixtures were maintained at 8-20 sccm and 70 sccm, respectively. The final coating architecture was comprised of a steel substrate, followed by a thin Cr adhesion layer and top ~1 μm hydrogenated DLC layer.

Rolling element bearings operating in wind turbine gearboxes employ coatings that are either applied only to rolling elements (hard DLC) or both rolling elements and raceways (i.e., black oxide). The material pairs tested in this study were designed to be consistent with the application of coatings on wind turbine bearing components. The performance of the H-DLC coatings was examined by testing four material pairs: uncoated roller on uncoated rings, H-DLC coated roller on uncoated rings, uncoated roller on H-DLC coated rings, and H-DLC coated roller on H-DLC coated rings. The uncoated on uncoated pairing was used as the baseline in comparison with the other materials pairs. A value of 1200 Peak/Peak acceleration (vibration) was used as the cut-off limit in the tests to determine the cycles to failure. The 1200 P/P acceleration was a vibration reading from the accelerometer that was placed close to the contact zone and provided a view toward the progression of surface damage. Tests were suspended if the vibration exceeded the cut-off limit or exceeded 100 million contact cycles.

Characterization and Performance

Figure 3:
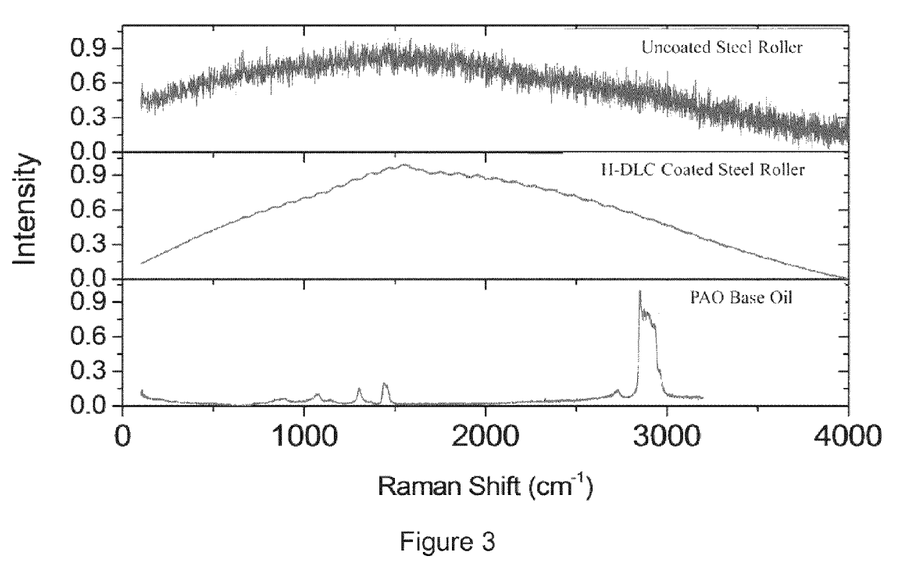
FIG. 3 shows Raman spectra of Steel roller (top) H-DLC coated roller (middle) and PAO base oil (bottom).

Specimens were characterized by white light interferometry, optical microscopy, and Raman spectroscopy, prior and subsequent to testing. A Bruker 3D optical profilometer was used to measure the surface roughness and surface topography of specimens. A Renishaw green light Raman spectrometer with a wavelength of 633 nm was used to probe the structural chemistry of the coated and uncoated specimens both prior to and after testing. Raman Instrument was calibrated using an internal silicon reference, and the spectra were recorded in the range of 100-4000 cm$^{-1}$. Raman spectra shown in FIG. 3 were obtained from an uncoated steel roller, and untested H-DLC-coated roller, and the PAO-4 base oil. Both steel and the as-deposited H-DLC show a broad and featureless spectrum that is typical for the materials. The PAO-4 base oil shows a strong characteristic feature at 2800 cm$^{-1}$ and few small peaks between 1000 cm$^{-1}$ and 1500 cm$^{-1}$.

Figure 4:
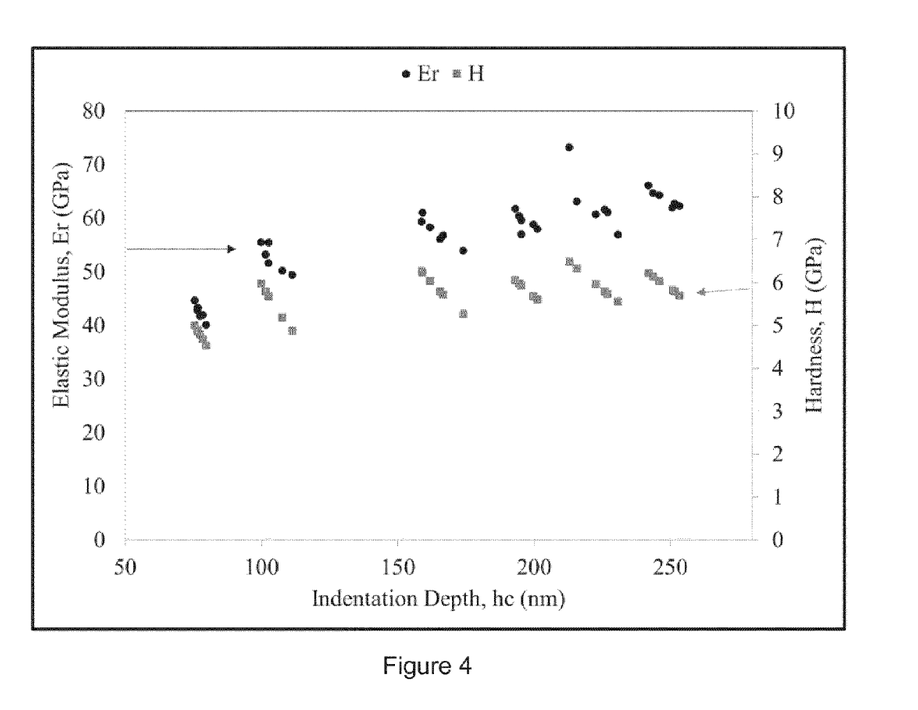
FIG. 4 shows the nano-indentation measurements on the H-DLC coatings with elastic modulus and hardness as a function of indentation depth of the coating.

Mechanical properties of the coating were measured by nanoindentation using a Hysitron Triboindenter TI—950 equipped with a Berkovich diamond probe and loads in the range of 0.5 mN to 12 mN. FIG. 4 shows the nanoindentation measurements on the H-DLC coatings. Nanoindentation measurements revealed that the hardness and elastic modulus values of the coating are about 6±1 GPa and 55±10 GPa, respectively.

Traction coefficients and P/P acceleration are plotted against contact cycles and are shown in FIG. 5 for the four materials pairs. Test parameters were Load=430N, SRR=40%, Oil=PA04, Temp.=55° C., Lambda=0.36. Also shown in the FIG. 5 are images of the roller wear tracks from each test. Vertical lines in the plot indicate instances where tests were stopped, the roller surface was inspected, and then the test was restarted. FIG. 5A shows the measurements obtained from the uncoated on uncoated pairing. Whereas the traction coefficient remained approximately constant at ~0.05 through the test, the P/P acceleration trace indicates that surface damage initiated at the beginning of the test and gradually increased until about 28 million cycles. Thereafter, the P/P acceleration rapidly increased and exceeded the cut off limit at about 31 million cycles. The image of the roller surface shows a large amount of damage. A close inspection of the image coupled with the P/P acceleration data suggests that micropits formed rapidly on the roller surface, grew in size, and coalesced to produce an almost continuously damaged surface within the wear track.

Figure 5A:
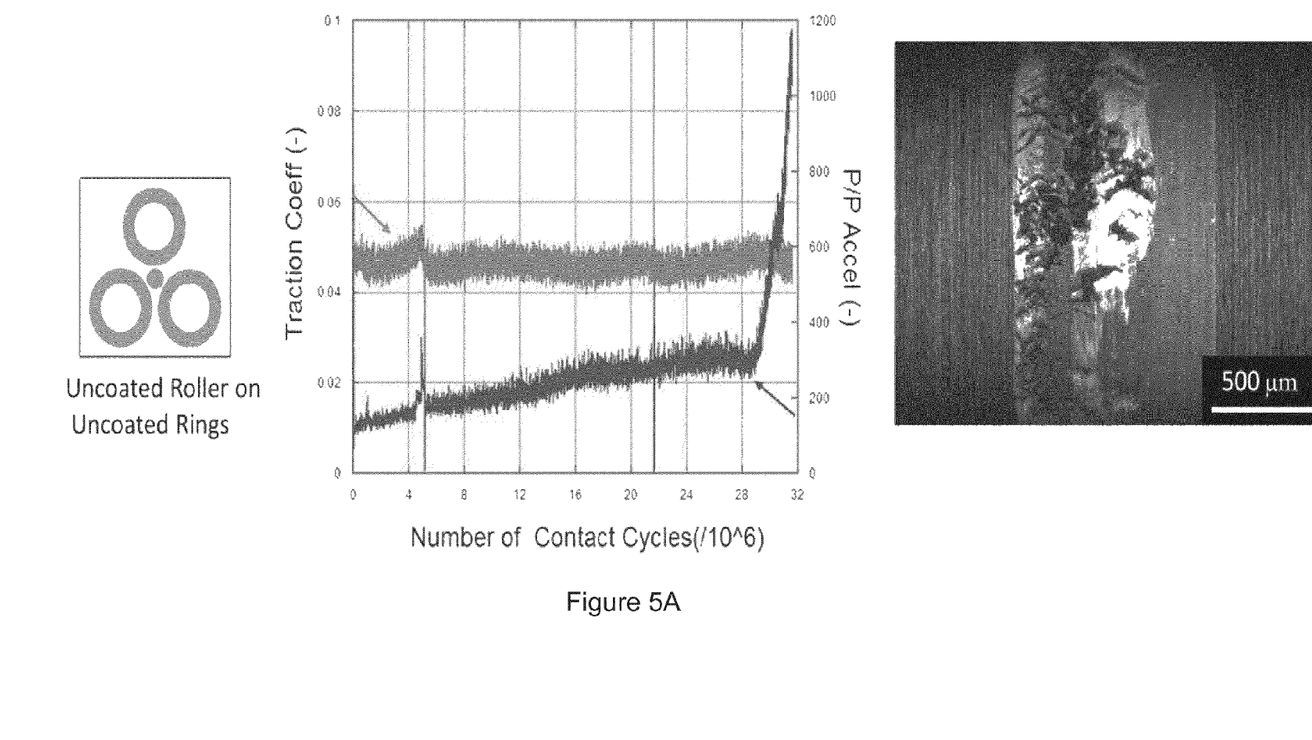
FIG. 5A illustrates traction coefficient and P/P acceleration for steel roller and steel ring.
Figure 5B:
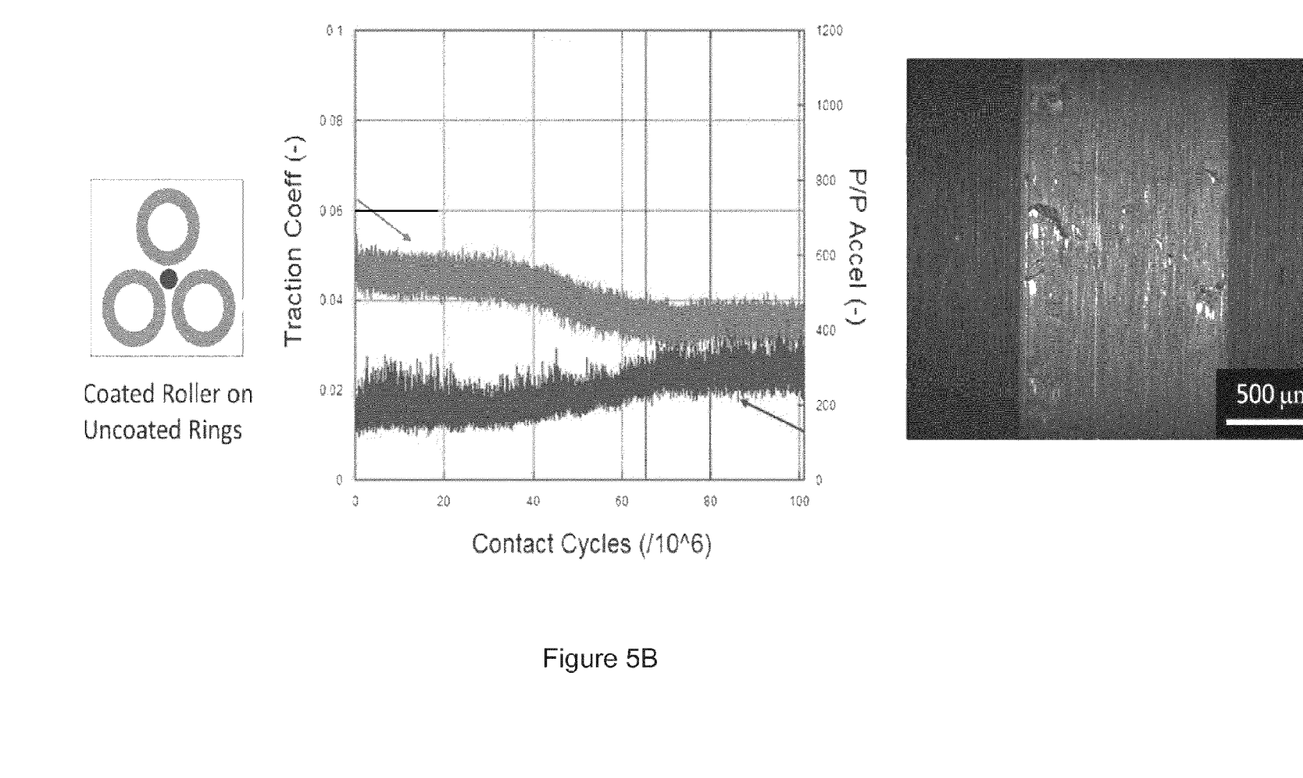
FIG. 5B illustrates traction coefficient and P/P acceleration for H-DLC roller and steel rings.

FIG. 5B shows the traction coefficient and P/P acceleration as a function of number of contact cycles on the roller for the H-DLC-coated roller on uncoated rings pairing. This test achieved 100 million cycles without exceeding the P/P acceleration limit. The traction coefficient remained steady at ~0.05 for first 40 million cycles and then began to decrease gradually until about 65 million cycles, and then remained steady for the rest of period at ~0.035. The P/P acceleration was inversely correlated with the traction coefficient. The optical image of the roller wear track after test termination is shown on right, and the image shows that small regions of the coating delaminated. Since the coating delamination could account for an increase in the P/P acceleration, it is speculated that the decrease in the traction coefficient may also be associated in some way with the coating delamination.

Figure 5C:
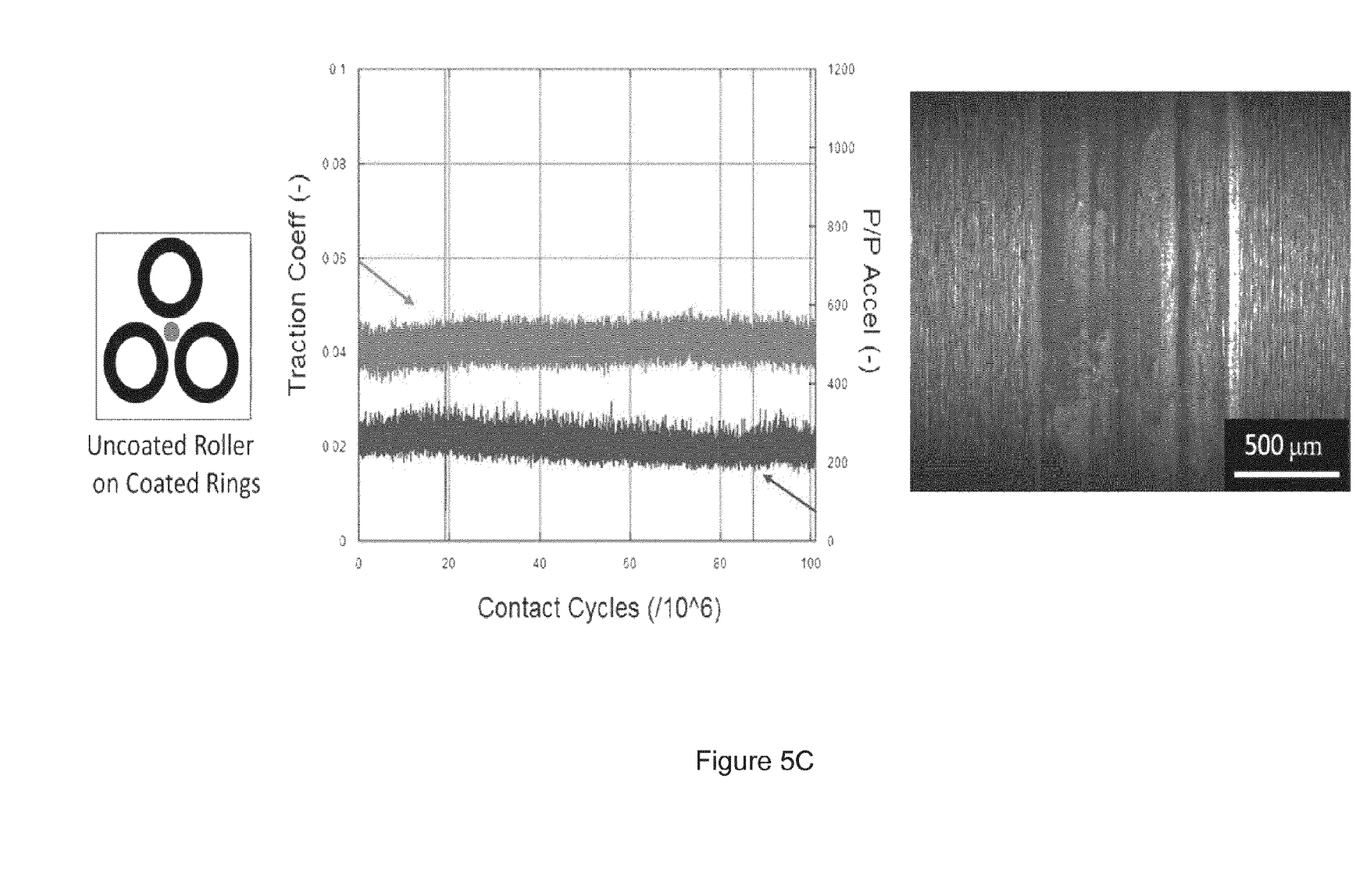
FIG. 5C illustrates traction coefficient and P/P acceleration for steel roller and H-DLC rings.

FIG. 5C shows the traction coefficient and P/P acceleration as a function of number of contact cycles for the pairing of the uncoated roller and H-DLC-coated rings. No changes in the traction coefficient or P/P acceleration were observed in the test. The traction coefficient was measured to be about ~0.04 and the P/P acceleration value was ~200 after completing 100 million cycles. The image of the uncoated steel roller shown on the right indicates that no micro or macro pits formed during testing and that a tribofilm was generated over a large region of the wear track.

Figure 5D:
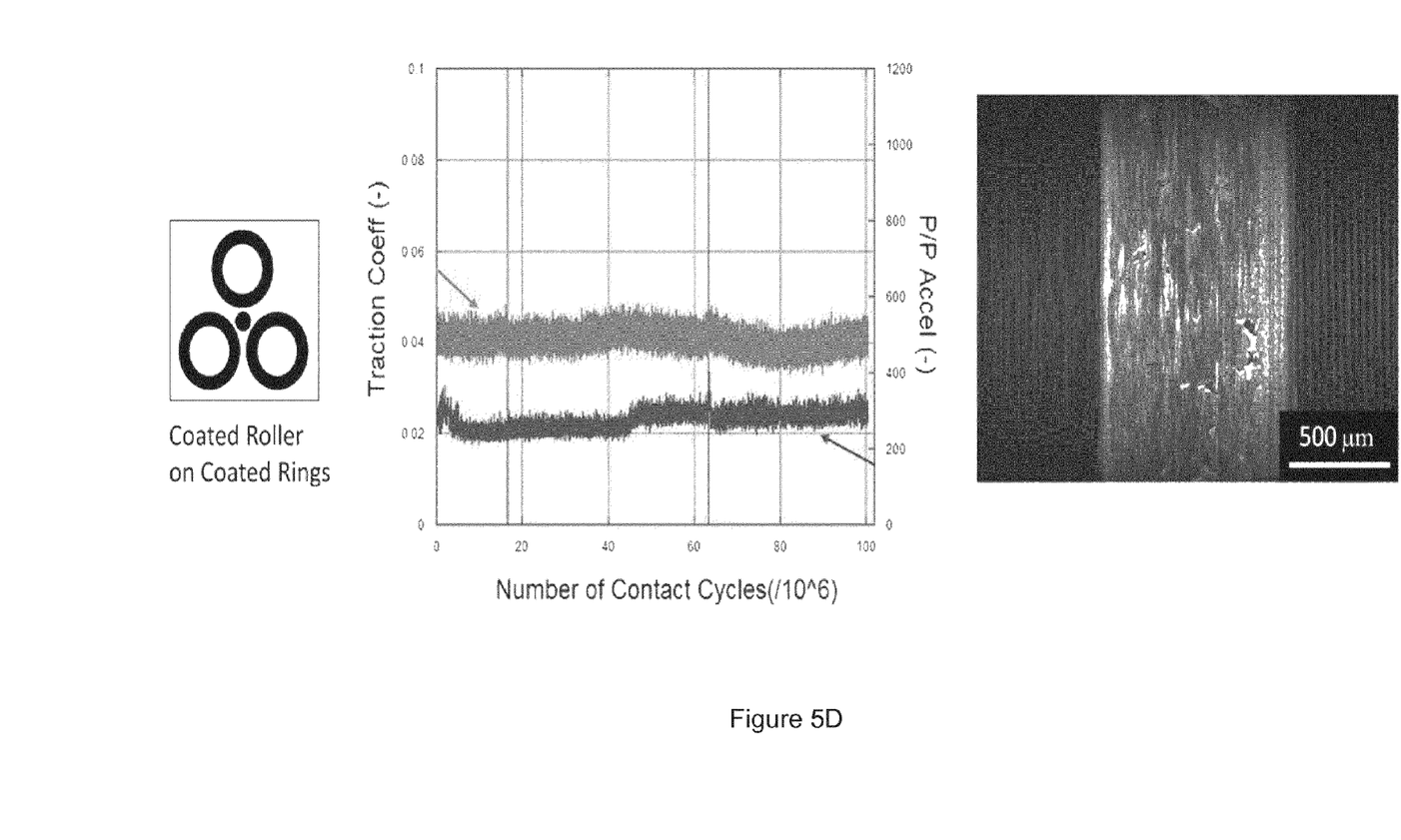
FIG. 5D illustrates traction coefficient and P/P acceleration for H-DLC rings and H-DLC roller pairs.
Figure 6A:
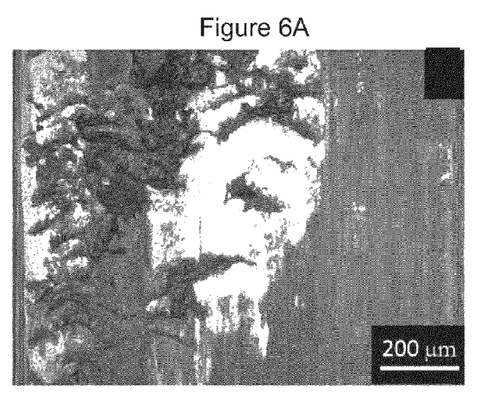
FIG. 6A shows uncoated roller on uncoated rings.
Figure 6B:
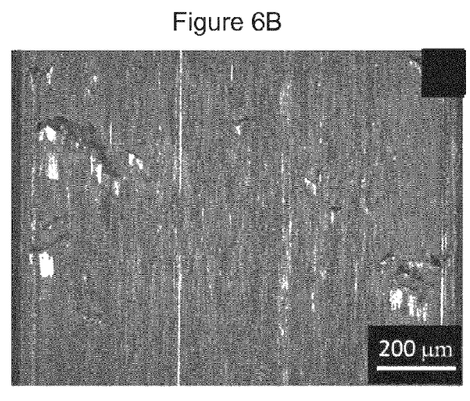
FIG. 6B shows H-DLC-coated roller on uncoated rings.
Figure 6C:
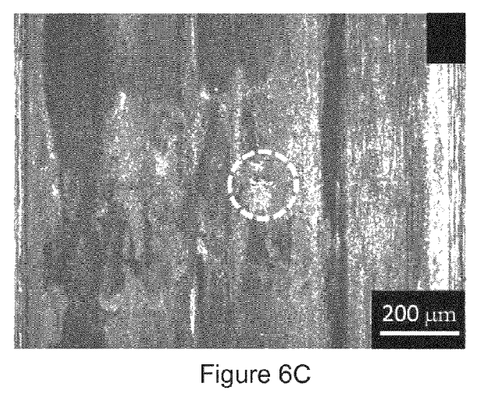
FIG. 6C shows an uncoated roller on H-DLC-coated rings.
Figure 6D:
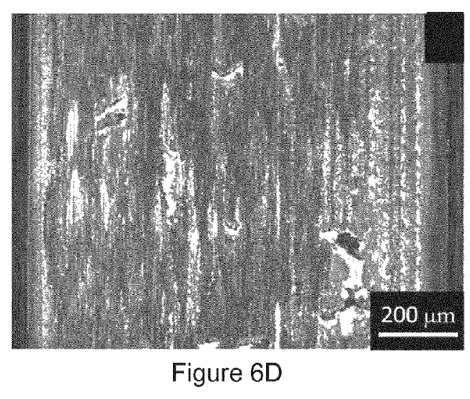
FIG. 6D shows H-DLC-coated roller on H-DLC-coated rings.

FIG. 5D shows the traction coefficient and P/P acceleration as a function of number of contact cycles for the pairing of the H-DLC-coated roller and H-DLC-coated rings. The test run for 100 million cycles. The traction coefficient was constant at ~0.04 throughout the test while the P/P acceleration increased slightly after about 45 million cycles from a value of 200 to 300 and remained at this value until the end of test. Thus, a steady state appear to be reached. The image of the wear track on the roller contains a few pits, but no significant damage was observed.

All the tests where at least one surface was coated with the H-DLC lasted for 100 million cycles without experiencing a significant amount of surface damage. FIGS. 6a-d show high magnification topographical images of roller surfaces after testing for (a) uncoated roller on uncoated rings (b) H-DLC-coated roller on uncoated rings (c) uncoated roller on H-DLC-coated rings, and (d) H-DLC-coated roller on H-DLC-coated rings.

Figure 7:
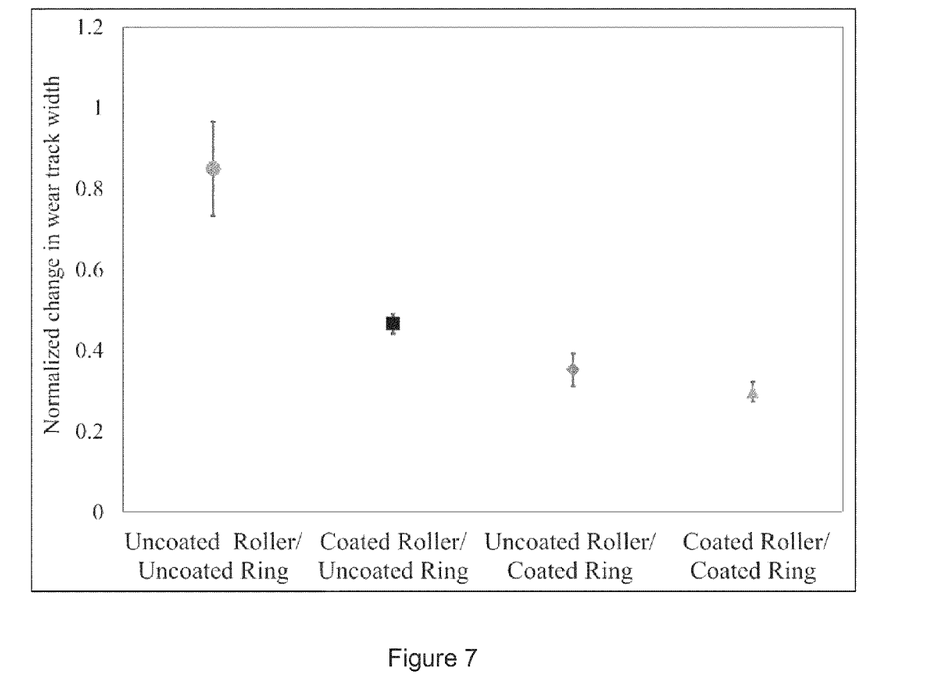
FIG. 7 shows the change in roller track width before and after testing, indicating the amount of wear that occurs on the roller sample

Roller wear was quantified according to a change in width of the roller wear track. An optical microscope was used to measure the track width at multiple locations. Values shown in FIG. 7 are averages and standard deviations of four measurements of the change in roller track width. The data shown in the figure was normalized based on the number of contact cycles. The calculated track width was divided by the total no contact cycles after failure or after termination. The total change in width of wear track was below 50 μm in all tests but the uncoated pairing which showed the largest change in track width. A clear trend is seen between change in track width and the amount of coating available to participate in the tribological contact. For example, the least amount of coating passing through the contact was for the H-DLC-coated roller on uncoated ring pair, while the largest amount of coating passing through the contact was for the H-DLC-coated roller on H-DLC-coated ring pair, considering the difference in coated sample surface area. This trend suggests that the wear occurring on the roller depended upon the amount of H-DLC present in the contacts. In the current study 1 um thickness was used, but the thickness can reasonably range from 0.1-10 um}

Figure 8:
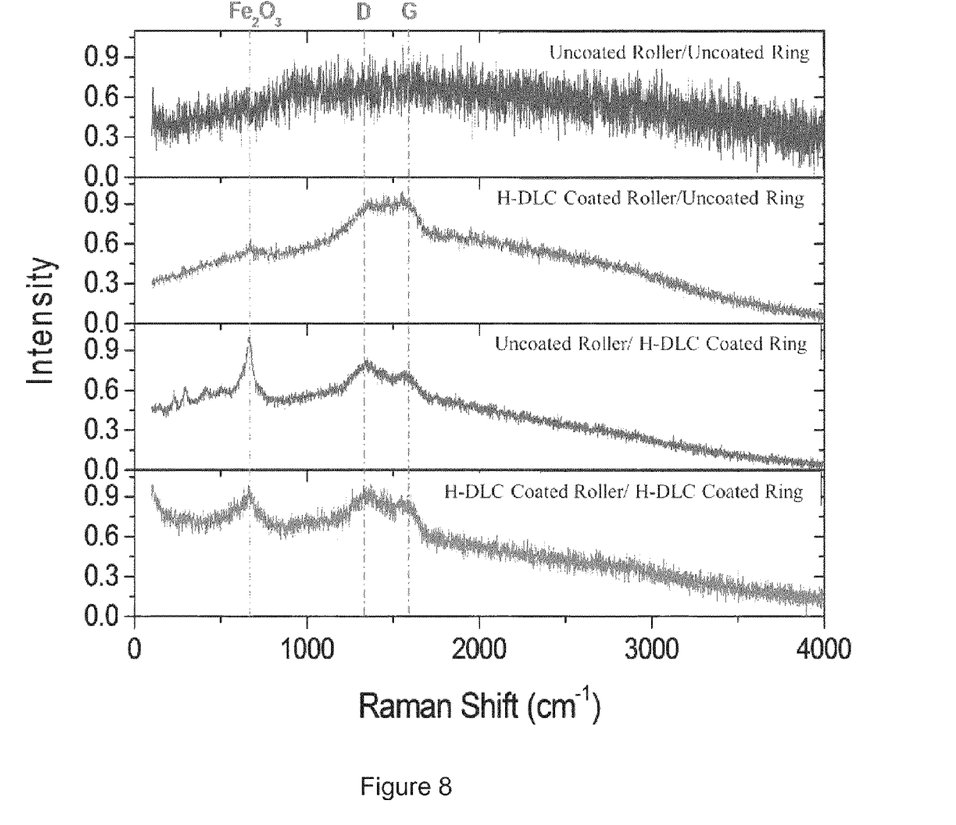
FIG. 8 shows Raman spectra of rollers after test completion for uncoated roller on uncoated ring (top), H-DLC coated roller on uncoated rings (top-middle) uncoated roller on H-DLC coated rings (bottom-middle), and H-DLC coated roller on H-DLC coated rings material pairs (bottom).

Raman spectra obtained on the tested specimens are shown in FIG. 8. No significant differences are observed from spectrum of the untested roller in FIG. 3 and the spectrum of the steel roller after testing. The Raman spectrum from the H-DLC-coated roller on uncoated rings pairing shows D and G peaks at around 1332 cm$^{-1}$ and 1580 cm$^{-1}$, respectively, which are typical of DLCs with high sp$^2$ bond characters. A minor peak around 600 cm$^{-1}$ corresponds to $\alpha$-Fe$_2$O$_3$ that was probably generated from asperities on the rings. The Raman spectrum of the tribofilm formed on the roller during the uncoated roller on H-DLC-coated ring test shows similar D & G features, a strong peak at 670 cm$^{-1}$ from Fe$_3$O$_4$ or FeO, and minor peaks around 222 cm$^{-1}$ and 298 cm$^{-1}$ from $\alpha$-Fe$_2$O$_3$. Since the tribofilm formed on the roller in the uncoated roller on H-DLC coated ring test has similar D & G features in its Raman spectrum as the Raman spectra of the wear tracks from the H-DLC-coated roller on H-DLC-coated ring and H-DLC-coated roller on uncoated ring testing, there is a strong indication that the H-DLC coating undergoes a transition from its initial amorphous hydrocarbon state to disordered graphite within the wear track and then transfers from the coated rings to the wear track on the uncoated roller.

CONCLUSIONS

This research evaluated the tribological performance of highly hydrogenated diamond like carbon films in mixed rolling and sliding contacts for bearings and gears in wind turbine drive train. H-DLC films were deposited on cylindrical specimens and compared against untreated samples using PAO 4 synthetic base oil as a lubricant. H-DLC coated samples provided significant improvement in mitigating surface fatigue (micropitting) compared to uncoated steel samples. The results concluded from the experimental investigation are as follows:

Nano-indentation results revealed that the coatings are highly elastic in nature and have hardness values (~6 GPa) comparable to that of steel substrate.

Uncoated steel/steel pairs failed after 32 million cycles whereas no failure was observed with soft-highly hydrogenated diamond like carbon coated test samples up to 100 million cycles.

Roller track width measurements revealed no significant change in the track at the end of test compared to initial track width.

Raman analysis showed microstructural transformations of the H-DLC inside the roller wear track.

Results indicate that coating only one side of the material pair is sufficient to delay the onset of surface fatigue of test rollers by more than 100 million cycles. H-DLC appears to be an effective solution for components that suffer from surface initiated fatigue.

In one embodiment, the H-DLC improves wear and performance on rolling and sliding surfaces resulting in improved reliability, energy savings, and maintenance of developed systems. In one embodiment, the coating is used on gear boxes, such as for wind turbines.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of making a pitting resistant carbon coating comprising:
   removing organic material from a metallic substrate;
   etching a surface of the metallic substrate;
   depositing a carbide forming layer on the etched metallic substrate;
   exposing the carbide forming layer to methane gas, forming a carbide layer; and
   depositing an amorphous hydrogenated diamond-like coating on the carbide layer;
   wherein the hydrogenated diamond-like coating has a hardness the range of 2-7 GPa and an elasticity equal to or less than 60 GPa.

2. The method of claim 1, wherein the metallic substrate is steel.

3. The method of claim 2, further comprising forming an amorphous carbon tribofilm.

4. The method of claim 2, wherein the deposited amorphous hydrogenated diamond-like coating has a thickness at least $\frac{1}{10}^{th}$ a thickness of the metallic substrate.

5. The method of claim 1, wherein the hydrogenated diamond-like coating has a hardness the range of 5-6 GPa and an elasticity between 50 and 60 GPa.

6. The method of claim 1, wherein the hydrogenated diamond-like coating is deposited by a pulsed magnetron sputtering system.

7. The method of claim 6, wherein the pulsed magnetron deposition uses power supplied to carbon targets in the range of 1000-2000 W and pulsed DC bias of 35 to 50 volts was supplied at 250-350 KHz.

8. The method of claim 7, wherein the methane was maintained at 8-20 sccm.

9. The method of claim 8, wherein the deposition by pulsed magnetron uses argon gas mixture maintained 70 sccm as a working gas.

* * * * *